United States Patent
Werkheiser

(10) Patent No.: US 8,423,942 B2
(45) Date of Patent: Apr. 16, 2013

(54) FILL PATTERNING FOR SYMMETRICAL CIRCUITS

(75) Inventor: Jason K. Werkheiser, Fogelsville, PA (US)

(73) Assignee: Agere Systems LLC, Allentown, PA (US)

( * ) Notice: Subject to any disclaimer, the term of this patent is extended or adjusted under 35 U.S.C. 154(b) by 987 days.

(21) Appl. No.: 12/339,407

(22) Filed: Dec. 19, 2008

(65) Prior Publication Data

US 2010/0155956 A1    Jun. 24, 2010

(51) Int. Cl.
G06F 17/50         (2006.01)

(52) U.S. Cl.
USPC ............. 716/119; 716/54; 716/116; 716/139; 257/E21.444; 257/E21.521

(58) Field of Classification Search ............. 326/41; 716/119
See application file for complete search history.

(56) References Cited

U.S. PATENT DOCUMENTS

| | | | | |
|---|---|---|---|---|
| 6,904,581 | B1 * | 6/2005 | Oh ............................... | 716/122 |
| 7,242,274 | B2 * | 7/2007 | Terrovitis ...................... | 336/200 |
| 7,512,921 | B2 * | 3/2009 | Shibuya ........................ | 716/119 |
| 7,661,078 | B1 | 2/2010 | Noice et al. | |
| 2005/0167702 | A1 | 8/2005 | Booth et al. | |
| 2006/0284673 | A1 | 12/2006 | Peruzzi et al. | |
| 2008/0121939 | A1 * | 5/2008 | Murray et al. ................ | 257/202 |

OTHER PUBLICATIONS

Sinha, Debjit, et al., "Impact of Modern Process Technologies on the Electrical Parameters of Interconnects," 20th International Conference on VLSI Design (VLSID'07), 0-7695-2762-0/07, IEEE Computer Society, pp. 875-880.

Stine, Brian E., et al., "The Physical and Electrical Effects of Metal-Fill Patterning Practices for Oxide Chemical-Mechanical Polishing Processes," IEEE Transactions on Electron Devices, vol. 45, No. 3, March 1998, 0018-9383/98, pp. 665-679.

* cited by examiner

*Primary Examiner* — Zandra Smith
*Assistant Examiner* — Pamela E Perkins
(74) *Attorney, Agent, or Firm* — Mendelsohn, Drucker & Associates, P.C.; Yuri Gruzdkov; Steve Mendelsohn

(57) ABSTRACT

A fill-placement method, according to which symmetrical fill patterns are used to insert fill tiles into one or more interconnect levels corresponding to symmetrical circuitry. The fill-placement method can be used, for example, in the fabrication of an integrated circuit having at least two complementary portions for which relatively tight circuit-matching requirements need to be met.

17 Claims, 6 Drawing Sheets

100

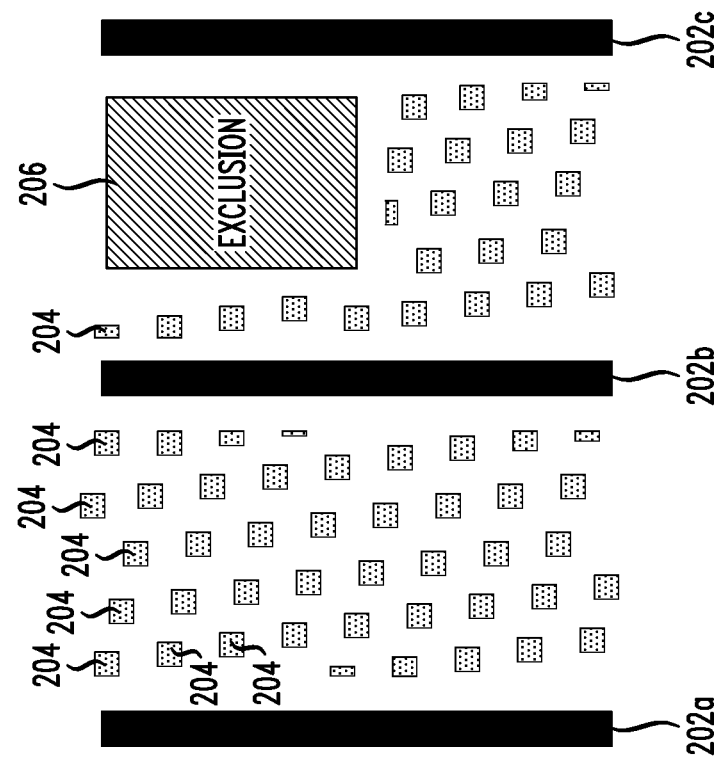
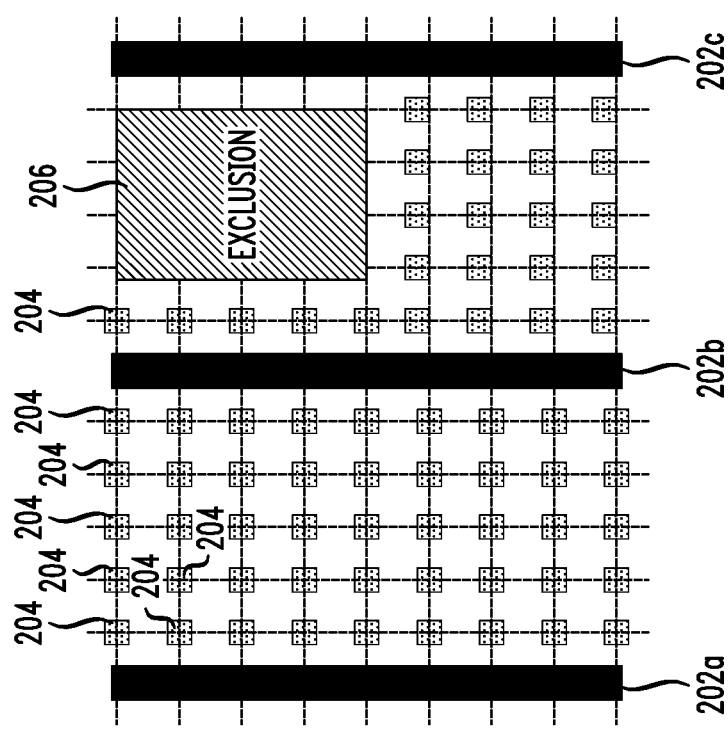

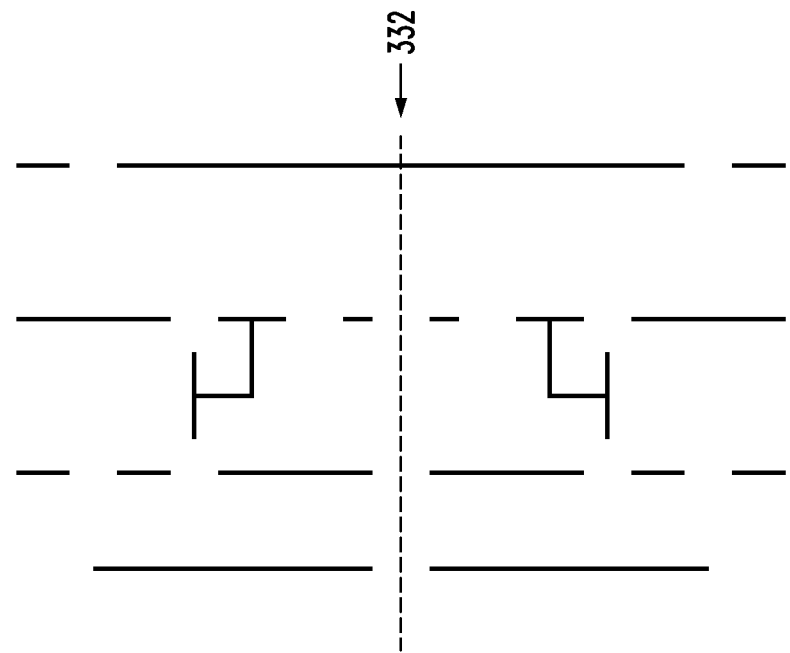
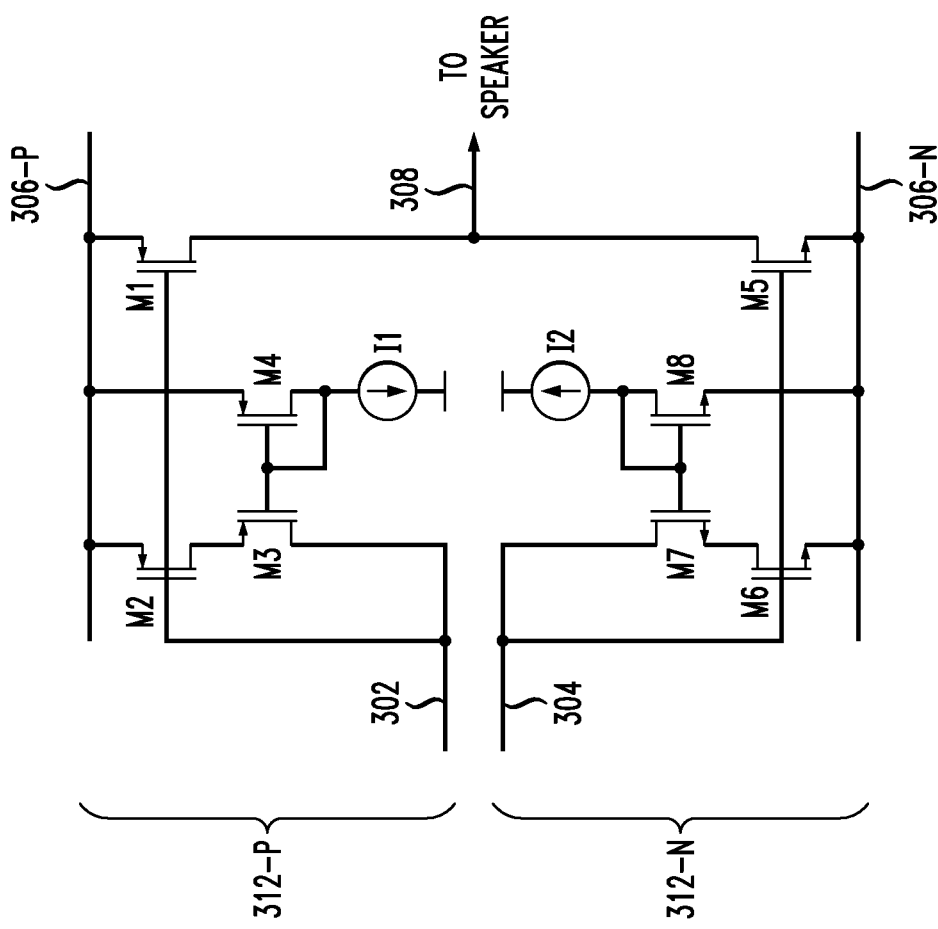
FIG. 3B
330
FIG. 3A
300

500

FILL PATTERNING FOR SYMMETRICAL CIRCUITS

BACKGROUND OF THE INVENTION

1. Field of the Invention

The present invention relates generally to die-planarization techniques and, more specifically, to placement of fill tiles in an interconnect structure of an integrated circuit (IC).

2. Description of the Related Art

This section introduces aspects that may help facilitate a better understanding of the invention(s). Accordingly, the statements of this section are to be read in this light and are not to be understood as admissions about what is in the prior art or what is not in the prior art.

Chemical-mechanical polishing (CMP) is a planarization technique that is widely used in IC fabrication. A surface of the die subjected to CMP undergoes (i) chemical reactions induced by a slurry and (ii) mechanical abrasion by a CMP pad. Although CMP pads and slurries have improved significantly over the years, the smoothness of the resulting die surface is still not perfect and significant post-CMP surface-topography variations can occur for some circuit-layout patterns. As successive metal and dielectric layers are being deposited over a die and subjected to CMP during the fabrication of an interconnect structure for the IC, the post-CMP surface-topology variations translate into thickness variations within the interconnect levels and inter-level dielectric (ILD). These thickness variations might be detrimental to the IC yield and/or performance because they disturb lithographic imaging and throw off the electrical parameters (such as resistance and/or capacitance) of the interconnect structure.

One design for manufacturability (DFM) technique that improves surface planarity uses insertion of special metal patterns (often referred to as fills, dummies, or waffles) into the circuit layout to make the density distribution over the die as uniform as possible. Since the CMP material-removal rate is a function of local material density, the metal fill helps to reduce the above-described thickness variations. However, if not appropriately designed, the metal fill might have a net detrimental effect on the IC yield and/or performance, e.g., by adversely affecting certain sensitive signals in terms of their timing and/or integrity.

SUMMARY OF THE INVENTION

Problems in the prior art are addressed by various embodiments of a fill-placement method, according to which symmetrical fill patterns are used to insert fill tiles into one or more interconnect levels corresponding to symmetrical circuitry. The fill-placement method of the invention can be used, for example, in the fabrication of an integrated circuit having at least two complementary portions for which relatively tight circuit-matching requirements need to be met.

According to one embodiment, the present invention is a fill-placement method having the steps of: (A) selecting a die area corresponding to symmetrical circuitry; (B) identifying two or more symmetrical portions within the selected die area; (C) generating a seed fill pattern for a first of the identified symmetrical portions; and (D) replicating the seed fill pattern to generate a replicated fill pattern for at least one of the remaining one or more of the identified symmetrical portions.

According to another embodiment, the present invention is an integrated circuit having: (A) a semiconductor wafer having a plurality of circuit elements; and (B) a multilevel interconnect structure that electrically interconnects said circuit elements. The multilevel interconnect structure has an area corresponding to symmetrical circuitry. At least one interconnect level within said area comprises first and second symmetrical portions. Fill tiles within the second symmetrical portion form a fill pattern that replicates a fill pattern formed by fill tiles in the first symmetrical portion.

BRIEF DESCRIPTION OF THE DRAWINGS

Other aspects, features, and benefits of the present invention will become more fully apparent from the following detailed description, the appended claims, and the accompanying drawings in which:

FIGS. 2A-B show two representative fill patterns that can be used in various embodiments of the invention;

FIGS. 3A-B show a symmetrical differential amplifier that can be implemented according to one embodiment of the invention;

DETAILED DESCRIPTION

Figure 1A:
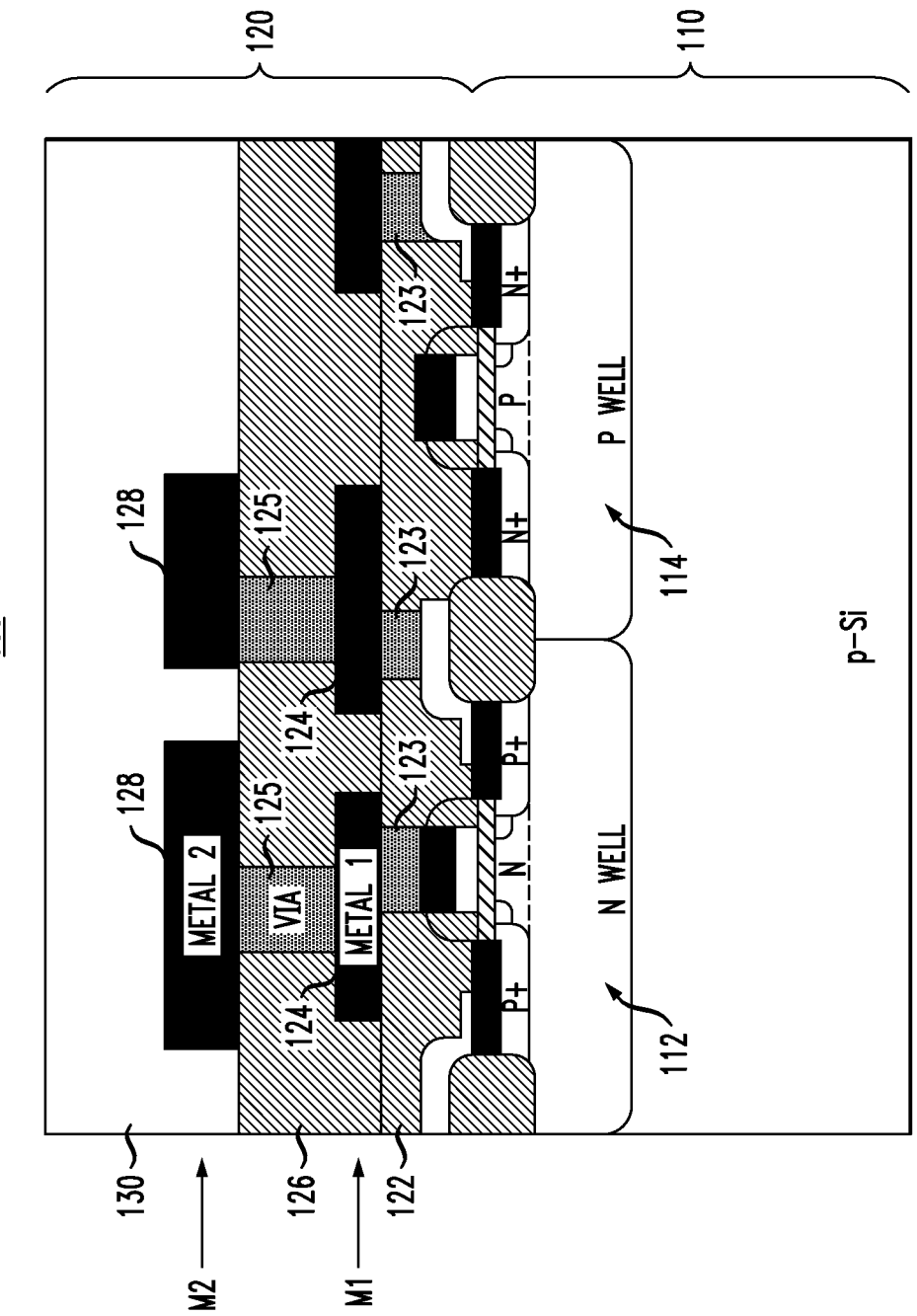
FIGS. 1A-B show a prior-art integrated circuit (IC) having a multilevel interconnect structure.
Figure 1B:
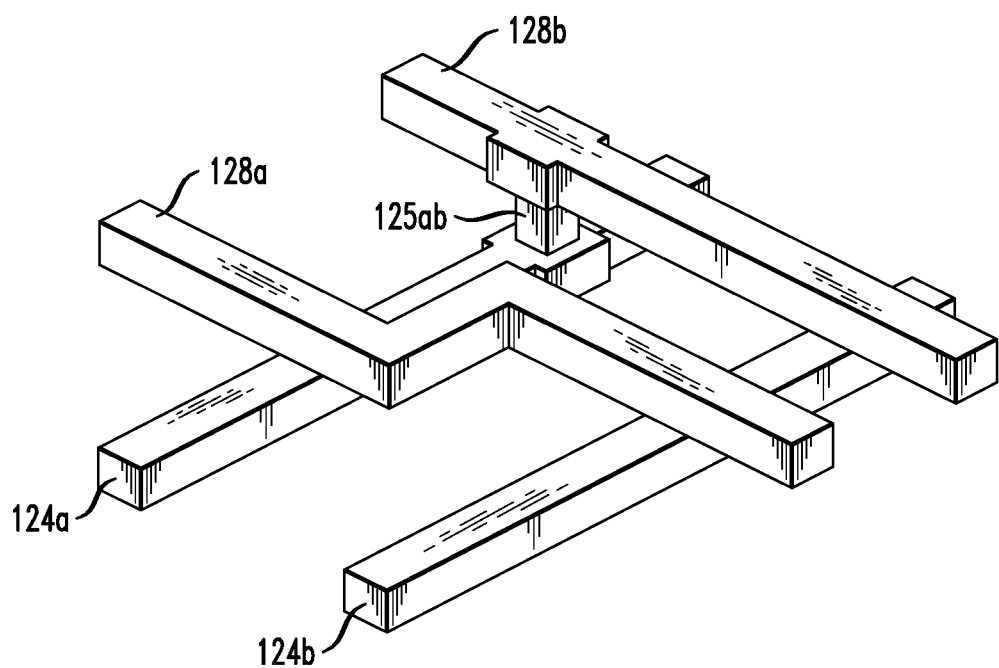

FIGS. 1A-B show a prior-art integrated circuit (IC) 100 having a multilevel interconnect structure 120. More specifically, FIG. 1A shows a schematic cross-sectional view of IC 100. FIG. 1B shows a perspective three-dimensional cutout view of a portion of interconnect structure 120.

Referring to FIG. 1A, IC 100 has a semiconductor wafer 110 in which various circuit elements, such as a p-channel field-effect transistor (p-FET) 112 and an n-channel field-effect transistor (n-FET) 114, have been formed as known in the art. Interconnect structure 120 serves to transport voltages and/or currents to and from the various circuit elements of wafer 110. In FIG. 1A, interconnect structure 120 is shown as having two levels (labeled M1 and M2) of metallic conductors, such as conductors 124 in level M1 and conductors 128 in level M2, surrounded by inter-level-dielectric (ILD) layers 122, 126, and 130. ILD layer 122 has metal-filled vias 123 that provide electrical connections between certain M1 conductors 124 and the corresponding electrical terminals in the circuit elements of wafer 110. ILD layer 126 has metal-filled vias 125 that provide electrical connections between certain M1 conductors 124 and certain M2 conductors 128. Each of ILD layers 122, 126, and 130 might comprise two or more sub-layers (not explicitly shown in FIG. 1) made of different dielectric materials. One skilled in the art will appreciate that interconnect structure 120 might have one or more additional levels of metallic conductors and the corresponding ILD layers with vias, all located above (i.e., at a greater distance from wafer 110 than) ILD layer 130.

FIG. 1B shows a representative layout of M1 conductors 124 and M2 conductors 128 in IC 100, with ILD layers 122, 126, and 130 and wafer 110 intentionally not shown for clarity. Conductors 124 and 128 comprise a plurality of substantially planar metal tracks that might have L-shaped turns similar to that of conductor 128a. Some of the conductors, such as M1 conductor 124a and M2 conductor 128b, might be electrically connected by one or more vias, such as via 125ab.

Design-for-manufacturability (DFM) specifications typically stipulate a density range for each interconnect level. For example, the DFM specifications might say that, for interconnect level M1, the metal density should be between 20% and 80% of a maximum density, where the maximum density is the density corresponding to a contiguous metal layer having no gaps in it. The DFM specifications usually have specific density constraints for each interconnect level. As already indicated above, the density specifications help to reduce the post-CMP surface-topology variations in the die.

FIGS. 2A-B show two representative fill patterns that can be used to meet DFM density specifications according to certain embodiments of the invention. More specifically, each of FIGS. 2A-B shows a top view of a single level 200 of a multilevel interconnect structure that can be used, e.g., to replace interconnect structure 120 in IC 100. Interconnect level 200 has (i) metal tracks 202a-c and (ii) a plurality of square or rectangular, electrically floating tiles 204 of metal fill placed between the metal tracks. The placement of metal-fill tiles 204 is subject to certain fill-placement rules that are described in more detail below in reference to FIG. 4. For example, the fill-placement rules might define exclusion areas, such as an exclusion area 206, within which no metal-fill tiles 204 are present. The fill-placement rules might specify a guard distance for metal tracks 202 and ban the placing of metal-fill tiles 204 closer to the metal tracks than the guard distance, etc.

In interconnect level 200, metal-fill tiles 204 are placed at intersections of grid lines. The embodiment of interconnect level 200 shown in FIG. 2A (and labeled 200') is filled with tiles 204 using two orthogonal sets of grid lines (indicated by the dashed lines in FIG. 2A), with one of the sets being aligned with metal tracks 202. In contrast, the embodiment of interconnect level 200 shown in FIG. 2B (and labeled 200") is filled with tiles 204 using two non-orthogonal sets of grid lines (not explicitly shown in FIG. 2B). The type of metal fill corresponding to interconnect level 200" is often referred to as "staggered fill" or "random fill." Staggering the tile shapes might have one or more of the following benefits: accurately predictable capacitive coupling to any metal track in an adjacent interconnect level, uniform duty cycle during mask write, and reduced shear stress during the fabrication process.

The description that follows pertains to symmetrical circuitry. As used herein, the term "symmetrical circuit" or "symmetrical circuitry" refers to a circuit, in which most circuit elements and the corresponding wires have symmetrical counterparts. Examples of symmetrical circuit elements are (i) the complementary opposites in a complementary metal-oxide-semiconductor (CMOS) circuit and (ii) duplicate copies of a circuit block, such as in different channels of a multi-channel device. One example of a symmetrical circuit is a current mirror (a frequently used circuit element/function), which is often implemented using cross-connected, structurally analogous input and output sides. Other circuits that can be implemented as symmetrical circuits include, but are not limited to, (i) differential circuits in general, such as differential amplifiers and differential buffers; (ii) multi-phase clock drivers and clock paths; (iii) digital-to-analog and analog-to-digital converters; (iv) voltage-controlled oscillators; (v) multipliers; (vi) comparators; (vii) signal termination circuitry; (viii) bias circuitry; and (ix) resistor-calibration circuitry. The use of symmetrical circuits can be prompted, e.g., by various circuit-matching requirements, such as capacitive parasitic matching (wherein the delay/load on one input or output needs to be as close as possible to the delay/load on another input/output), gain matching, bandwidth matching, signal balancing, etc.

FIGS. 3A-B show a symmetrical differential amplifier 300 that can be implemented according to one embodiment of the invention. More specifically, FIG. 3A shows a circuit diagram of amplifier 300. FIG. 3B shows a top view of an interconnect level 330 in an interconnect structure corresponding to amplifier 300 and functionally analogous to interconnect structure 120 of IC 100 (see FIG. 1). Only a brief functional description of amplifier 300 is given below. For a more-detailed functional description of amplifier 300, the reader is referred to U.S. Patent Application Publication No. 2006/0284673, which is incorporated herein by reference in its entirety.

Referring to FIG. 3A, amplifier 300 can serve, e.g., as an output stage of an audio amplifier that processes input signals 302 and 304 to generate an output signal 308 suitable for driving a speaker (not explicitly shown in FIG. 3). Signals 306-P and 306-N provide positive and negative power-supply voltages, respectively, that can be variable, signal-tracking power supply voltages. At a zero differential current provided by signals 302 and 304, the same amount of current is pulled from the source of transistor M3 and pushed into the source of transistor M7. The sizes of transistors M2, M3, M6, and M7 are chosen such that each of these transistors is in a saturation mode, which causes the gate-to-source voltage, $V_{GS}$, on each of output transistors M1 and M5 to be relatively small. Transistors M2 and M3 form a first current mirror that amplifies the current received via signal 302. Similarly, transistors M6 and M7 form a second current mirror that amplifies the current received via signal 304.

As signal 302 decreases from the value corresponding to the zero differential current, the $V_{GS}$ value for transistors M2 and M1 also decreases until these transistors are turned off completely. Simultaneously, signal 304 increases causing transistor M6 to leave the saturation mode and enter a triode mode of operation. The series resistance of transistors M6 and M7 increases sharply and a large $V_{GS}$ develops on transistor M5, which begins to draw current from ground through the speaker. For the opposite alternation, transistors M5 and M6 turn off and transistor M1 begins to push current through the speaker to ground. This current push-pull effected by transistors M1 and M5 generates analog output signal 308.

Amplifier 300 is a symmetrical circuit because it has complementary (symmetrical) portions 312-P and 312-N. Portions 312-P and 312-N have the following complementary pairs of circuit elements: (i) transistors M1 and M5; (ii) transistors M2 and M6; (iii) transistors M3 and M7; (iv) transistors M4 and M8; and (v) current sources I1 and I2. Portions 312-P and 312-N also have the following complementary wires: (i) the wires supplying signal 302 to transistors M1-M3 and the wires supplying signal 304 to transistors M5-M7; (ii) the wires supplying voltage 306-P to transistors M1, M2, and M4 and the wires supplying voltage 306-N to transistors M5, M6, and M8; (iii) the wires connecting transistors M3-M4 and current source I1 and the wires connecting transistors M7-M8 and current source I2; and (iv) the wire connecting transistor M1 to the speaker and the wire connecting transistor M5 to the speaker.

Solid lines in FIG. 3B indicate the layout of metal tracks in interconnect level 330. The vias that electrically connect the metal tracks of interconnect level 330 to metal tracks in the adjacent interconnect level(s) and/or to device terminals in the semiconductor wafer are omitted for clarity. As can be seen, the layout of metal tracks in interconnect level 330 has a symmetry plane indicated by a dashed line 332. One skilled in the art will appreciate that the presence of symmetry plane 332 in interconnect level 330 is related to the circuit symmetry corresponding to complementary (symmetrical) portions 312-P and 312-N.

In general, various symmetrical portions of an interconnect level corresponding to a symmetrical circuit might be related via one or more symmetry operations. Such symmetry operations might include, but are not limited to, (i) a mirror reflection with respect to a symmetry plane, (ii) a rotation by an arbitrary angle with respect to a rotation axis, (iii) an inversion operation with respect to an inversion axis, and (iv) a translation operation defined by a translation vector. Certain symmetrical portions belonging to different interconnect levels might have one or more symmetry operations in common. Alternatively or in addition, certain symmetrical portions belonging to two different interconnect levels might not have any symmetry operations in common. An integrated circuit comprising a symmetrical circuit might further comprise various non-symmetrical circuits. Various portions of the interconnect structure corresponding to such non-symmetrical circuits might not be necessarily related by a symmetry operation.

Figure 4:
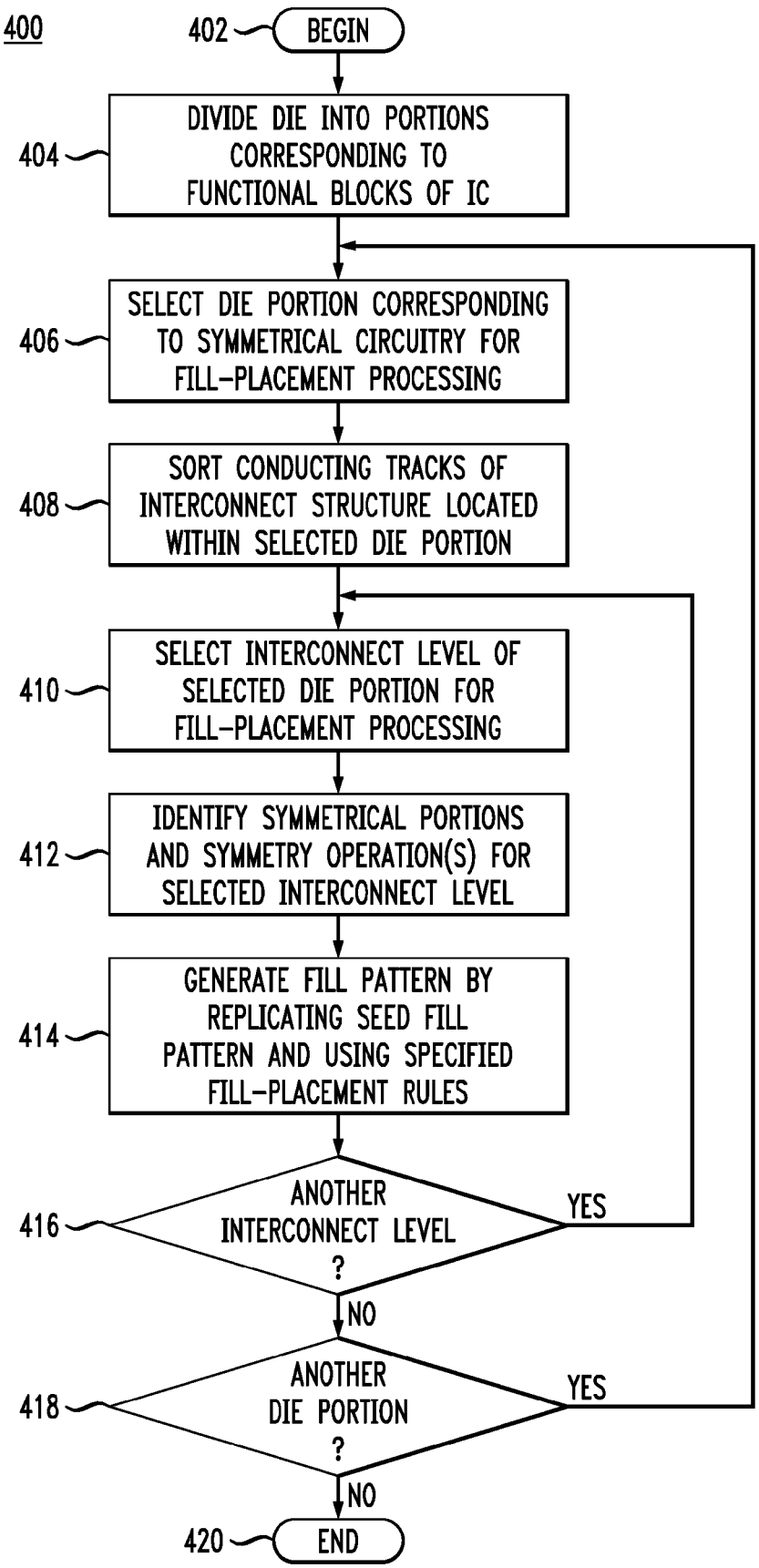
FIG. 4 shows a flowchart of a fill-placement method that can be used to insert a metal-fill pattern into various interconnect levels according to one embodiment of the invention.

FIG. 4 shows a flowchart of a method 400 that can be used to insert a metal-fill pattern into various interconnect levels according to one embodiment of the invention. The metal-fill pattern can be, e.g., analogous to one of those shown in FIGS. 2A-B. Method 400 can be incorporated into an IC-design-software tool, such as Virtuoso Layout Suite, which is commercially available from Cadence Design Systems, Inc., of San Jose, Calif.

Method 400 begins at step 402 where a database corresponding to the IC that is going to be subjected to fill-placement processing is loaded into the corresponding IC-design-software tool.

At step 404, the die having the IC is divided into portions corresponding to various functional circuit blocks. Some functional circuit blocks will have symmetrical circuitry, e.g., similar to amplifier 300, and other functional circuit blocks will have non-symmetrical circuitry. Fill patterns for the die portions corresponding to the symmetrical circuitry are generated using steps 406-418 of method 400, and fill patterns for the die portions corresponding to the non-symmetrical circuitry can be generated using a suitable prior-art fill-placement method or, alternatively, a modified version of method 400.

At step 406, one of the die portions corresponding to the symmetrical circuitry is selected for fill-placement processing.

At step 408, various conducting tracks of the interconnect structure located within the selected die portion are sorted into three categories: (1) the conducting tracks that carry power-supply and reference (e.g., ground) potentials; (2) the conducting tracks that carry "sensitive" signals, and (3) the conducting tracks that carry "non-sensitive" signals. The term "sensitive signal" refers to a signal that might have a relatively large detrimental effect on the performance of the IC if subjected to even a relatively small amount of cross-talk, interference, and/or timing disturbance. A sensitive signal can be a clock signal or a relatively weak input signal. For example, the conducting tracks that carry signals 306-P and 306-N in amplifier 300 would be sorted into the first category; the conducting tracks that carry signals 304 or 306 would be sorted into the second category; and the conducting tracks that do not fall into the first two categories would be sorted into the third category (see FIG. 3A).

At step 410, one interconnect level of the die portion selected at step 406 is selected for fill-placement processing. The interconnect levels can be selected in any specified order, e.g., starting from the interconnect level that is closest to the semiconductor wafer and incrementally going outwards. One or more interconnect levels can be flagged as exempt, meaning that no fill insertion needs to be performed for those levels. An exempt interconnect level will not be selected in step 410.

At step 412, two or more symmetrical portions and the corresponding symmetry operation(s), via which these symmetrical portions are related, are identified for the interconnect level selected at step 410. For example, symmetrical portions 312-P and 312-N and a mirror reflection with respect to symmetry plane 332 would be identified for interconnect level 330 (FIG. 3B).

At step 414, a fill pattern for the interconnect level selected at step 410 is generated using (i) the symmetry operation(s) identified at step 412 and (ii) the specified fill-placement rules. More specifically, first, a seed fill pattern is generated for a selected first of the symmetrical portions. Fill patterns for the other symmetrical portions are then generated by replicating the seed fill pattern. As used herein, the term "replicating" means that a replica of a fill pattern is generated by applying to that fill pattern a symmetry operation via which the two corresponding symmetrical portions are related. For example, if the first and second symmetrical portions are related via a mirror reflection with respect to a plane of symmetry, then the fill pattern for the second symmetrical portion is replicated by applying that mirror reflection to the seed fill pattern. If the first and second symmetrical portions are related via an inversion operation with respect to an inversion axis, then the fill pattern for the second symmetrical portion is replicated by applying that inversion operation to the seed fill pattern. If the first and second symmetrical portions are related via a rotation operation with respect to a rotation axis, then the fill pattern for the second symmetrical portion is replicated by applying that rotation operation to the seed fill pattern. If the first and second symmetrical portions are related via a translation operation defined by a translation vector, then the fill pattern for the second symmetrical portion is replicated by applying that translation operation to the seed fill pattern. An exemplary symmetrical fill pattern generated at step 414 is described below in reference to FIG. 5.

In one embodiment, step 414 employs the following seven fill-placement rules:

(A) Use fill tiles of one or more specified shapes: Rectangular tiles 204 (see FIG. 2) represent one example of a possible shape. In principle, any suitable shape or shapes can be used. Each shape is usually available in two or more (incrementally changing) sizes;

(B) Observe inter-tile spacing: The inter-tile spacing parameters are usually selected from two or more options that can be different for different interconnect levels;

(C) Maintain a selected guard distance between a conducting track and adjacent fill tiles: The guard distance is usually selected from two or more specified values that can be different for different interconnect levels;

(D) Attain a targeted effective density within the interconnect level: Typically, DFM specifications provide a density range and/or a preferred effective density value. The effective density is usually calculated using a discrete window, e.g., 100×100 $\mu m^2$, that is stepped, in some fashion, across the interconnect level. For each location of the window, the average density over the window is calculated and compared with the target value. Adjustments to the fill pattern are made as necessary to attain the desired density characteristics;

(E) Use staggered or non-staggered fill tiles: FIGS. 2A and 2B show representative examples of staggered and non-staggered fill tiles, respectively;

(F) Avoid placing fill tiles so that they are located directly below and/or directly above the conducting tracks that carry sensitive signals in a specified number of adjacent interconnect levels (hereafter referred to as the "keep-out depth"): The terms "directly below" and "directly above" mean that each "sensitive" conducting track in a particular interconnect level is used to define a corresponding corridor of a specified width, which is then projected upward or downward onto a different interconnect level to define the corresponding exclusion area therein. For example, if the present interconnect level is level N and the keep-out depth is two, then no fill tiles are placed in level N within the exclusion corridors that trace the "sensitive" conducting tracks belonging to interconnect levels N−2, N−1, N+1, and N+2. It is still permissible to place fill tiles in level N so that they are directly below and/or directly above the "sensitive" conducting tracks located in interconnect levels that are farther away from interconnect level N than interconnect levels N−2 and N+2; and (G) It is permissible to place fill tiles directly below and/or directly above the conducting tracks that carry power-supply and reference (e.g., ground) potentials and "non-sensitive" signals.

At step 416, it is determined whether another interconnect level of the die portion selected at step 406 needs to undergo fill-placement processing. If yes, then the processing of method 400 is directed back to step 410. If no, then the processing of method 400 is directed to step 418.

At step 418, it is determined whether another die portion needs to undergo fill-placement processing. If yes, then the processing of method 400 is directed back to step 406. If no, then the processing of method 400 is directed to step 420 where it is terminated.

Figure 5:
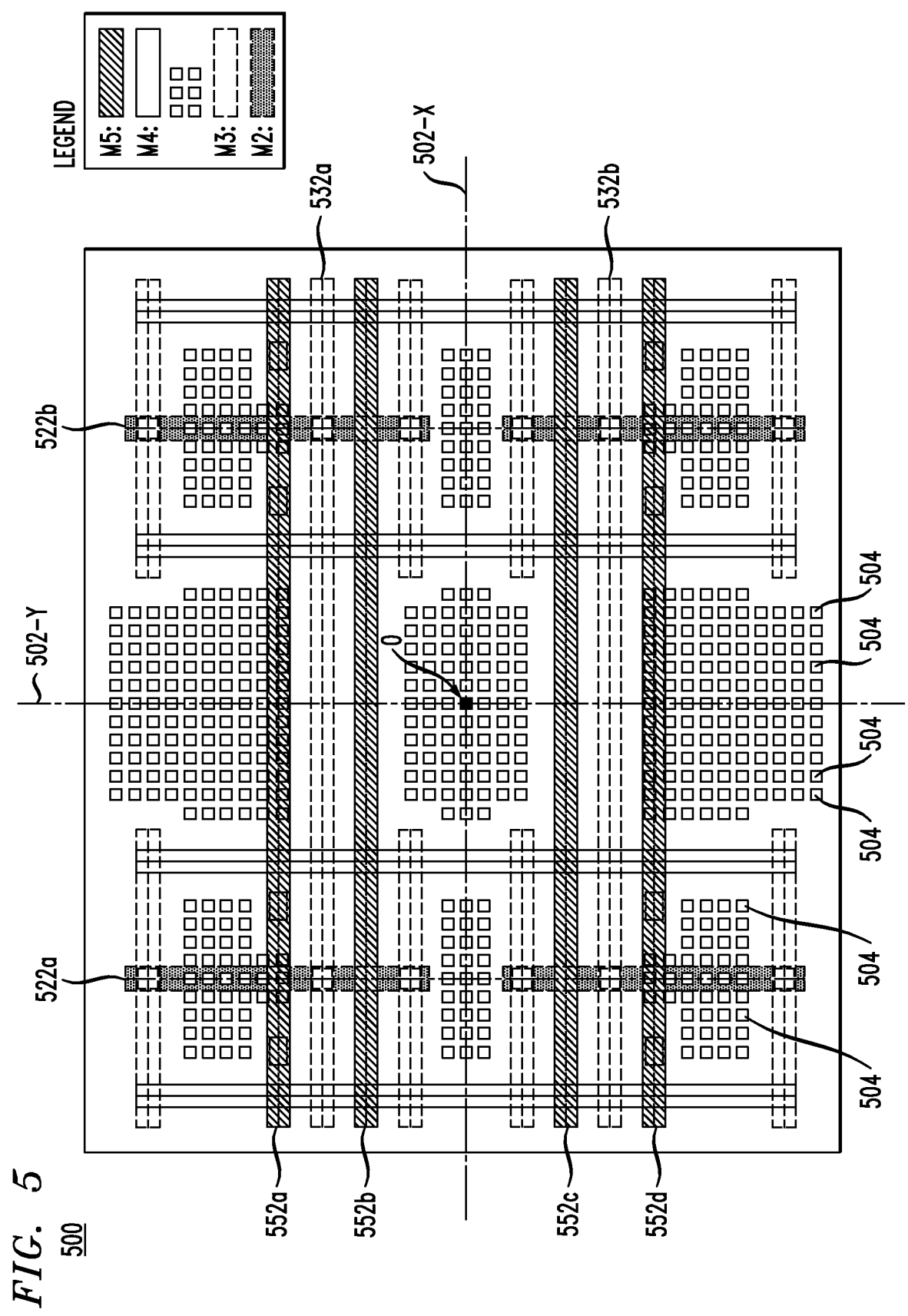
FIG. 5 shows a top, partial see-through view of an interconnect structure having a fill pattern according to one embodiment of the invention.

FIG. 5 shows a top, partial see-through view of a multilevel interconnect structure 500 having a fill pattern according to one embodiment of the invention. More specifically, FIG. 5 shows the relevant features of only four interconnect levels, i.e., interconnect levels M2-M5, of interconnect structure 500. Other interconnect levels of interconnect structure 500 are intentionally omitted for clarity. Furthermore, FIG. 5 shows the fill pattern corresponding to only a single interconnect level, i.e., interconnect level M4, of interconnect structure 500. The fill patterns corresponding to interconnect levels M2, M3, and M5 are intentionally omitted for clarity. The fill pattern shown in FIG. 5 has been inserted into interconnect level M4 using method 400.

Each of interconnect levels M2-M5 of interconnect structure 500 is characterized by at least three symmetry operations defined by: (i) a symmetry plane 502-X orthogonal to the plane of FIG. 5; (ii) a symmetry plane 502-Y also orthogonal to the plane of FIG. 5; and (iii) an inversion axis O located at the intersection of these two symmetry planes. Due to the fill-placement processing performed at steps 412-414 of method 400, the fill patterns within different symmetrical portions (quadrants) of interconnect level M4 are related via these symmetry operations. As can be seen, each of the four quadrants defined by symmetry planes 502-X and 502-Y have fill patterns that are replicas of each other. In particular, the fill patterns in the diagonally located quadrants can be superimposed by applying a 180-degree rotation. The fill patterns in any two side-sharing quadrants can be superimposed by a mirror reflection. One skilled in the art will appreciate that, alternatively, level M4 of interconnect structure 500 may be implemented so that it is symmetrical with respect to only one axis (for instance, X or Y) or three axes (X, Y, and Z, where the Z axis is orthogonal to the plane of FIG. 5).

The keep-out depth corresponding to interconnect structure 500 is one (see the definition of "keep-out depth" in rule (F) above). As a result, interconnect level M4 does not have fill tiles 504 directly below, e.g., "sensitive" conducting tracks 552b-c of interconnect level M5 and directly above, e.g., "sensitive" conducting tracks 532a-b of interconnect level M3. In contrast, interconnect level M4 does have fill tiles 504, e.g., directly below "power-supply" conducting tracks 552a,d of interconnect level M5 (see rule (G) above). Interconnect level M4 also has fill tiles 504 directly above "sensitive" conducting tracks 522a-b of interconnect level M2 because these "sensitive" conducting tracks are outside of the keep-out depth (see rule (F) above).

While this invention has been described with reference to illustrative embodiments, this description is not intended to be construed in a limiting sense. For example, fill tiles having any suitable shapes can be used. Although various embodiments of the invention have been described in reference to metal-fill tiles, other suitable materials (such as poly-silicon, a silicon oxide, a metal oxide, or a metal nitride) can similarly be used to form the fill tiles. The fill tiles can be electrically floating or tied-off (i.e., connected to an electrical terminal held at a specified potential). Various fill-placement rules that differ from the seven placement rules described in reference to FIG. 5 can be used in various embodiments of fill-placement method 400. Various modifications of the described embodiments, as well as other embodiments of the invention, which are apparent to persons skilled in the art to which the invention pertains are deemed to lie within the principle and scope of the invention as expressed in the following claims.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. The use of terms such as height, length, width, top, bottom, is strictly to facilitate the description of the invention and is not intended to limit the invention to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

What is claimed is:

1. A fill-placement method, comprising:
   selecting a die area corresponding to symmetrical circuitry;
   identifying two or more symmetrical portions within the selected die area;
   generating a seed fill pattern for a first of the identified symmetrical portions, said seed fill pattern formed by a plurality of fill tiles positioned between conducting tracks; and
   replicating the seed fill pattern to generate a replicated fill pattern for at least one of the remaining one or more of the identified symmetrical portions, wherein:
      the seed fill pattern and a first replicated fill pattern are related through a first mirror reflection;
      the seed fill pattern and a second replicated fill pattern are related through a second mirror reflection that is different from the first mirror reflection; and
      each of the first and second mirror reflections is defined by a respective symmetry plane, with the two symmetry planes being orthogonal to each other.

2. The method of claim 1, wherein the symmetrical circuitry comprises a plurality of complementary opposite circuit elements.

3. The method of claim 1, wherein the step of identifying comprises selecting an interconnect level of the selected die area, wherein the first symmetrical portion and a second of the identified symmetrical portions are both parts of the selected interconnect level.

4. The method of claim 1, wherein:
   the selected die area comprises at least first and second interconnect levels;
   two or more of the identified symmetrical portions that are parts of the first interconnect level are related by a first symmetry operation; and
   two or more of the identified symmetrical portions that are parts of the second interconnect level are related by a second symmetry operation that is different from the first symmetry operation.

5. The method of claim 1, further comprising sorting conducting tracks of a plurality of interconnect levels in the selected die area into at least first and second categories, wherein the step of generating comprises, within a specified keep-out depth, avoiding placing fill tiles directly below and directly above the conducting tracks that have been sorted into the first category.

6. The method of claim 5, wherein the step of generating further comprises placing fill tiles at one or both of (i) directly below and (ii) directly above the conducting tracks that have been sorted into the second category.

7. The method of claim 6, wherein the second category includes conducting tracks that carry power-supply signals.

8. The method of claim 5, wherein the specified keep-out depth is greater than one interconnect level.

9. A plurality of fill-placement patterns for a corresponding plurality of interconnect levels of an integrated circuit, said plurality of fill-placement patterns generated by implementing on a computer the method of claim 1.

10. An integrated circuit having a plurality of interconnect levels, each having a respective fill-placement pattern, wherein at least one of said fill-placement patterns has been generated by implementing on a computer the method of claim 1.

11. A non-transitory machine-readable medium, having encoded thereon program code, wherein, when the program code is executed by a machine, the machine implements the method of claim 1.

12. The method of claim 1, wherein:
   the fill tiles are to be implemented using a metal; and
   at least some fill tiles of the plurality are configured to be electrically floating.

13. A fill-placement method, comprising:
   selecting a die area corresponding to symmetrical circuitry;
   identifying two or more symmetrical portions within the selected die area;
   generating a seed fill pattern for a first of the identified symmetrical portions;
   replicating the seed fill pattern to generate a replicated fill pattern for at least one of the remaining one or more of the identified symmetrical portions; and
   sorting conducting tracks of a plurality of interconnect levels in the selected die area into at least first and second categories, wherein the step of generating comprises, within a specified keep-out depth, avoiding placing fill tiles directly below and directly above the conducting tracks that have been sorted into the first category.

14. The method of claim 13, wherein the step of generating further comprises placing fill tiles at one or both of (i) directly below and (ii) directly above the conducting tracks that have been sorted into the second category.

15. The method of claim 14, wherein the second category includes conducting tracks that carry power-supply signals.

16. The method of claim 13, wherein the specified keep-out depth is greater than one interconnect level.

17. A fill-placement method, comprising:
   selecting a die area corresponding to symmetrical circuitry;

identifying two or more symmetrical portions within the selected die area;

generating a seed fill pattern for a first of the identified symmetrical portions; and replicating the seed fill pattern to generate a replicated fill pattern for at least one of the remaining one or more of the identified symmetrical portions, wherein:

the seed fill pattern and the replicated fill pattern are related via a rotation operation with respect to a rotation axis; or the seed fill pattern and the replicated fill pattern are related via a translation operation; or a first replicated fill pattern and a second replicated fill pattern are related to the seed fill pattern via a first mirror reflection and via a second mirror reflection, respectively, wherein each of the first and second mirror reflections is defined by a respective symmetry plane, with the two symmetry planes being orthogonal to each other; or a first replicated fill pattern and a second replicated fill pattern are related to the seed fill pattern via a mirror reflection and via an inversion operation with respect to an inversion axis, respectively.

* * * * *